US008103880B2

(12) United States Patent
Bailey

(10) Patent No.: US 8,103,880 B2
(45) Date of Patent: Jan. 24, 2012

(54) METHOD FOR COMMUNICATION BETWEEN COMPUTING DEVICES USING CODED VALUES

(75) Inventor: Michael Paul Bailey, Provo, UT (US)

(73) Assignee: Adobe Systems Incorporated, San Jose, CA (US)

( * ) Notice: Subject to any disclaimer, the term of this patent is extended or adjusted under 35 U.S.C. 154(b) by 1152 days.

(21) Appl. No.: 11/313,443

(22) Filed: Dec. 20, 2005

(65) Prior Publication Data

US 2006/0277179 A1 Dec. 7, 2006

Related U.S. Application Data

(60) Provisional application No. 60/687,286, filed on Jun. 3, 2005.

(51) Int. Cl.
*H04L 9/32* (2006.01)
(52) U.S. Cl. ........ 713/178; 713/168; 713/181; 713/187; 380/277; 380/259; 380/44
(58) Field of Classification Search .................... 713/178
See application file for complete search history.

(56) References Cited

U.S. PATENT DOCUMENTS

| | | | | |
|---|---|---|---|---|
| 6,112,232 A * | 8/2000 | Shahar et al. | ................. | 709/217 |
| 6,374,266 B1 * | 4/2002 | Shnelvar | ............................. | 1/1 |
| 6,654,346 B1 * | 11/2003 | Mahalingaiah et al. | ...... | 370/235 |
| 6,996,536 B1 * | 2/2006 | Cofino et al. | ................... | 705/26 |
| 7,051,038 B1 * | 5/2006 | Yeh et al. | ....................... | 707/603 |
| 7,165,105 B2 * | 1/2007 | Reiner et al. | .................... | 709/224 |
| 7,178,104 B1 * | 2/2007 | Harry et al. | .................... | 715/205 |
| 7,240,077 B1 * | 7/2007 | Edelman et al. | ............. | 707/203 |
| 7,680,889 B2 * | 3/2010 | Blumenau et al. | ............ | 709/206 |
| 2001/0018740 A1 * | 8/2001 | Marukawa | ..................... | 713/186 |
| 2002/0083178 A1 * | 6/2002 | Brothers | ....................... | 709/226 |
| 2003/0005036 A1 * | 1/2003 | Mitzenmacher | .............. | 709/203 |
| 2003/0072454 A1 * | 4/2003 | Krawetz | ........................ | 380/284 |
| 2003/0182420 A1 * | 9/2003 | Jones et al. | .................... | 709/224 |
| 2004/0006693 A1 * | 1/2004 | Vasnani et al. | ................ | 713/168 |
| 2004/0111507 A1 * | 6/2004 | Villado et al. | ................. | 709/224 |
| 2004/0199630 A1 * | 10/2004 | Sarkissian et al. | ............ | 709/224 |
| 2004/0258089 A1 * | 12/2004 | Derechin et al. | ............. | 370/465 |
| 2005/0010759 A1 * | 1/2005 | Wakiyama | .................... | 713/160 |
| 2005/0021731 A1 * | 1/2005 | Sehm et al. | .................... | 709/224 |
| 2005/0061336 A1 * | 3/2005 | Goetz et al. | .................... | 128/899 |
| 2005/0216441 A1 * | 9/2005 | Thomas et al. | .................... | 707/1 |
| 2005/0216581 A1 * | 9/2005 | Blumenau et al. | ............ | 709/223 |
| 2006/0277197 A1 * | 12/2006 | Bailey | .............................. | 707/10 |
| 2007/0143487 A1 * | 6/2007 | Zhong et al. | .................... | 709/230 |
| 2007/0150948 A1 * | 6/2007 | De Spiegeleer | ................. | 726/22 |

* cited by examiner

*Primary Examiner* — Kambiz Zand
*Assistant Examiner* — Yonas Bayou
(74) *Attorney, Agent, or Firm* — Robert C. Kowert; Meyertons, Hood, Kivlin, Kowert & Goetzel, P.C.

(57) ABSTRACT

A system for improved communication system for providing web analytics data between a first computing device and a second, remote computing device preferably encodes frequently requested data into code words, and also provides the remote client with a look-up table and decoding logic. In one embodiment, the present invention also includes a method for updating the local look-up table in the event the table does not have a data value for a given code.

34 Claims, 6 Drawing Sheets

METHOD FOR COMMUNICATION BETWEEN COMPUTING DEVICES USING CODED VALUES

CROSS-REFERENCES TO RELATED APPLICATIONS

The present application claims priority under 35 U.S.C. §119(e) to U.S. Provisional Patent Application No. 60/687,286, filed on Jun. 3, 2005, entitled "METHOD FOR COMMUNICATION BETWEEN COMPUTING DEVICES USING CODED VALUES" which is incorporated by reference in its entirety.

BACKGROUND OF THE INVENTION

1. Field of the Invention

This invention relates generally to methods for improving communication between computing devices. More particularly, the present invention relates to a system and method for efficient communication wherein codes or hash values are used to replace long character strings. Still more particularly, the present invention is a system for improving communication speed and minimizing bandwidth in providing web analytics data between a server and a client.

2. Background of the Invention

Computing systems including their coupling to each other via networks is well known in the art. Such systems can be used in client/server architectures as known in the art to transmit, receive and present data in a variety of formats. However, one issue, especially when using public networks such as the Internet, is the speed at which data can be sent from servers to clients. With the improvements in processing power for both servers and personal computers, the problem is not their processing capabilities, but rather the bandwidth of the network connection between them. Particularly for web analysis/manipulation and data presentation associated with web analytics, the bandwidth of the network is a serious limitation to the effectiveness of these tools because users become frustrated if they have to wait a considerable time before receiving the data of interest. Thus, there is need for systems or methods that solve this problem.

One attempt by the prior art to provide encoding for communication between computing devices is shown in FIG. 1. FIG. 1 illustrates a conventional system including a first computing device 102 and a second computing device 106 coupled for communication via a network 104. To improve communication, a look-up table 108 may be provided for encoding data streams sent from the first computing device 102 to the second computing device 106 over the network 104. Although shown as a separate from the first computing device 102 in FIG. 1, the look-up table 108 is preferably part of the computing system 102. Moreover, the look-up table 108 could be directly coupled to the network 104 for communication or may route all communication through the first computing device 102 as shown by dotted lines 112 and 114, respectively. However, one problem with the prior art architecture is that traffic is actually increased because the network 104 is used transmit all access to the look-up table 108 so that every time second computing device 106 decodes an encoded word, additional traffic is generated and the network 104 is used for communication necessary to decode the encoded stream. Thus, there is a need for a system that can optimize and improve the speed of communication over a network connection.

SUMMARY OF THE INVENTION

The system of the present invention provides an improved communication system for providing web analytics data from a first computing device such as server to a second, remote computing device such as a client. The improved communication system preferably encodes frequently requested data into code words, and also provides the remote client with a look-up table and decoding logic. The system preferably includes a first computing device having a hash generator and a look up table, and a second computing device having a hash translator, a code retriever and a look up table. At the first computing device, the hash generator and lookup table are used to generate hash codes for strings that are frequently output. These values or codes are then substituted for the strings and transmitted to the second computing device. At the second computing the device, the hash translator identifies the strings, replaces them with the original string and sends the data on for further processing at the second computing device. If a code does not have a corresponding string in the look up table, the code retriever communicates with the first computing device to obtain the string corresponding to the code and store it and the string in the look up table at the second computing device. In one embodiment, the present invention also includes a method for updating the local look-up table in the event the table does not have a data value for a given code.

DETAILED DESCRIPTION OF THE PREFERRED EMBODIMENTS

Figure 1:
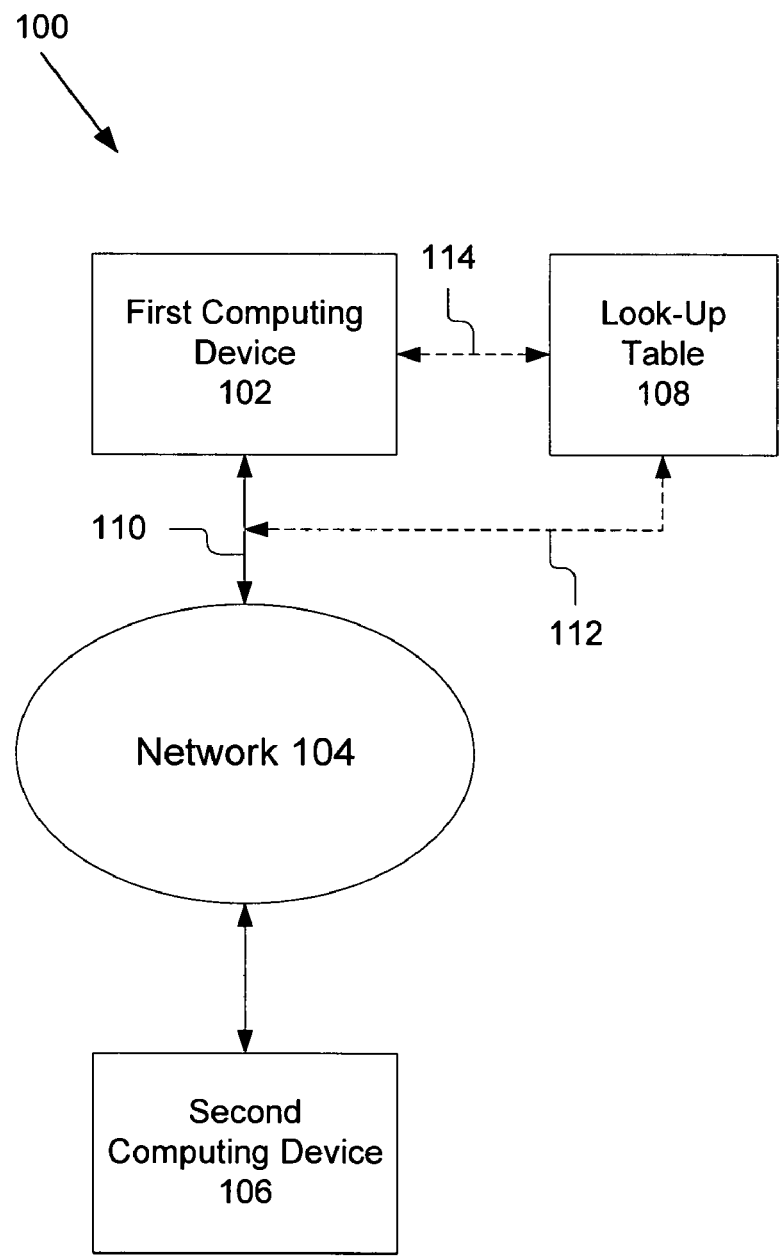
FIG. 1 is a block diagram of a prior art system for communicating between computing devices.
Figure 2:
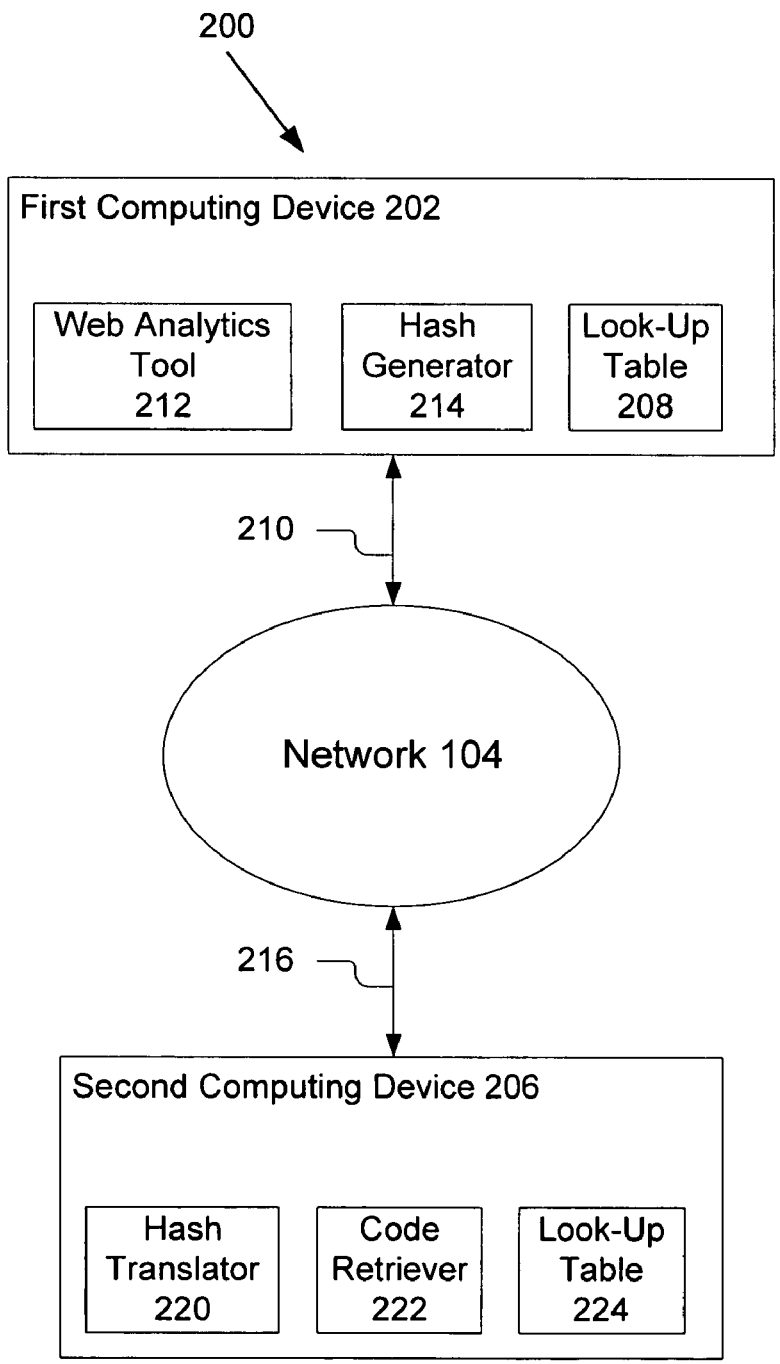
FIG. 2 is block diagram of a preferred embodiment of a system for efficient communication between computing devices according to the present invention.

A system 200 of the present invention for improved communication for providing web analytics data from a first computing device 202 to a second computing device 204 is shown in FIG. 2. The system 200 preferably includes the first computing device 202, a network 104 and the second computing device 206. The present invention will now be described in the context of a single first computing device 202 communicating with a single second computing device 206 for ease of understanding and convenience; however, a more typical application is a first computing device 202 communicating with many second computing devices 206, or a plurality of first computing devices 202 communicating with respective groups or many second computing devices 206. In general, the present invention is able to reduce the amount of data transmitted over the network 104 by encoding certain long variable length data strings and sending the encoded values to the second computing device 206. Upon receipt of such encoded values at the second computing device 206, the second computing device 206 translates them back into the original data string and then passes them onto other modules for presentation and display to the user.

Figure 6:
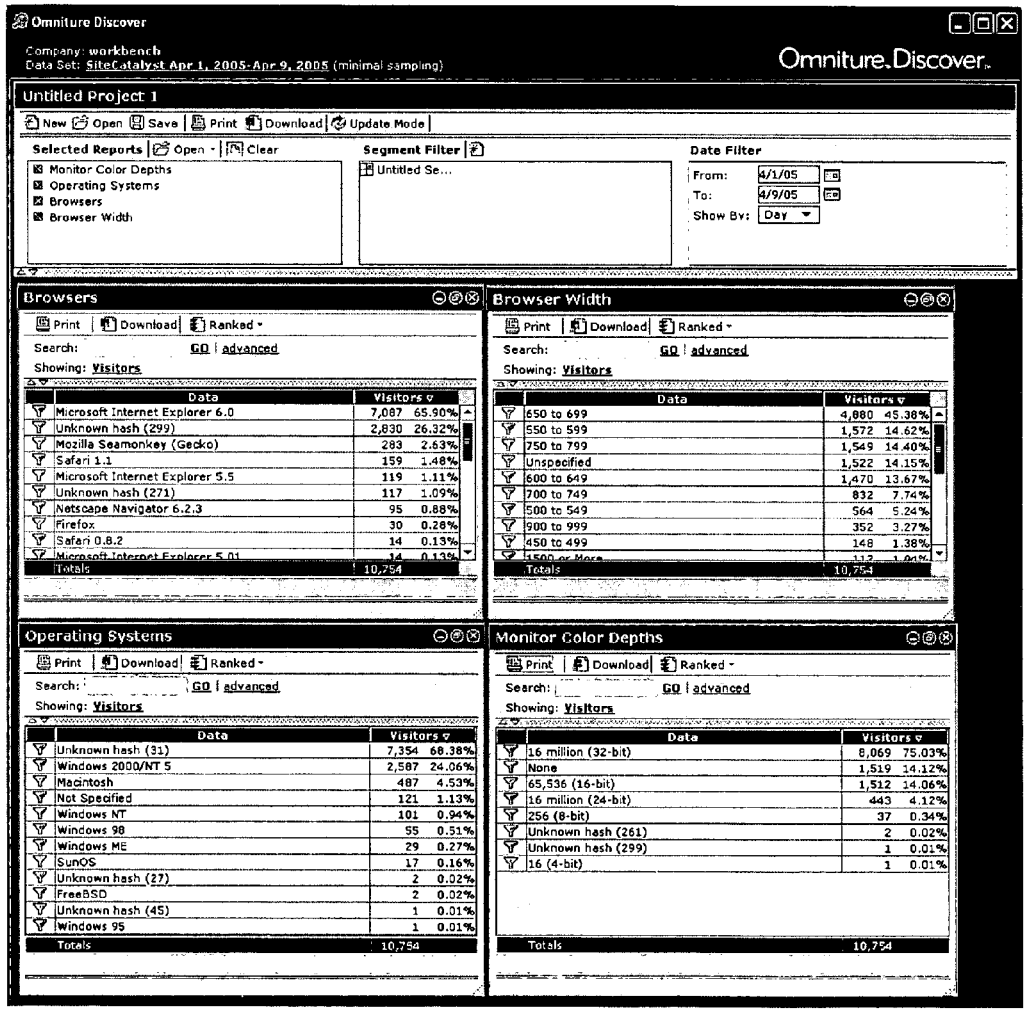
FIG. 6 is a graphical representation of a display device shown a data segment generated by the present invention.

The first computing device 202 is a conventional computing device such as a server and includes a connection to the network 104 via line 210 and is capable of executing various programs such as the present invention. The first computing device 202 preferably includes storage devices (not shown) for temporary and permanent storage such as memory and hard disk drives. The first computing device 202 includes applications, programs and other code executable on the first computing device 202. The computing device 202 preferably includes a web analytics tool 212 and operates as a web server for web analytics and reporting for providing data from a data set representing interaction with web pages such as SiteCatlyst V.11 provided by Omniture of Orem, Utah. When operating on the first computing device 202 these tools provide data to the second computing device 206 for presentation to the user. An exemplary display of such information by the second computing device 206 is shown in FIG. 6.

The first computing device 202 also includes a hash generator 214 and a look-up table 208 to optimize the communication with the second computing device 206 over the network 104. The hash generator 214 and look-up table 208 are responsive to and used by the web analytics tool 212 to encode certain portions of data that are repeatedly sent from the first computing device 202 to the second computing device 206. The hash generator 214 takes a variable length string and generates a hash value corresponding to the data string. This hash function may be any one of conventional types available such as MD2, MD4, and MD5 developed by Rivest or Secure Hash Algorithm (SHA) as specified in the Secure Hash Standard (SHS) and developed by NIST. The hash generator 214 is coupled to the look-up table 208 and sends the data string and hash value to the look-up table 208 for storage therein. The look-up table 208 is memory of a conventional type and is coupled to the web analytics tool 212 for providing hash values. Once a string is encoded as a hash value, the web analytics tool 212 sends the hash value in place of the string over the network 104. The web analytics tool 212 can send the hash value along with corresponding data or other information such as display commands or formatting information.

The network 104 is any one of a conventional type such as the Internet, a local area network (LAN), or a wide area network (WAN). The network 104 has predefined protocols for sending packets of data between devices coupled to the network 104. The network 104 may be of any conventional types and have any one of various topologies.

The second computing device 206 is a conventional computing device such as a personal computer, but also includes programs or code providing the communication capability of the present invention. The second computing device 206 includes modules and programs (not shown) responsive to the web analytics tool 212 of the first computing device 202 and user input to provide web analytics and reporting needs. The second computing device 206 further comprises the hash translator 220, the code retriever 222 and the look-up table 224 for optimizing communication with the first computing device 202.

The hash translator 220 receives hash values or codes and translates them back to the original data string. The hash translator 220 is coupled to the look-up table 224, and compares the received hash value to entries in the look-up table 224. If there is a corresponding entry in the hash look-up table 224, then that value is used instead of the received hash value and passed onto other modules of the second computing device 206 for presentation or display to the user. The hash translator 220 is also coupled to the code retriever 222 to notify the code retriever 222 if a hash code does not exist. Alternatively, the look-up table 224 communicates with the code retriever 222 to retrieve any hash values and strings not already in the look-up table 224 as they are requested.

If there is not a corresponding entry in the hash look-up table 224, the hash translator 220 notifies the code retriever 222. The code retriever 222 then communicates with the first computing device 202 over the network 104 and retrieves the data string corresponding to the hash value. Once the string has been returned over the network 104, the code retriever 222 adds an entry into the hash look-up table 224 with both the hash value and its corresponding data string.

Those skilled in the art will recognize that the hash look-up table 224 may act as a buffer that is continually updated, as new data strings are needed. The hash look-up table 224 is preferably maintained in active memory for the entire duration of a user session. However, unlike the prior art, the hash values and strings need be sent over the network 104 only once because they are stored locally at the second computing device 206. Moreover, those skilled in the art will recognize that at the beginning of a session, the hash look-up table 224 may be pre-populated with hash values and strings either from the last session of the user or from a default list of most commonly used strings and hash values. Further, those skilled in the art will recognize that there could be a module in the first computing device 202 to send the string/value pairs to the second computing device 206 during initialization, a module in the second computing device 206 to retrieve the string/value pairs from the first computing device 206, or modules in both computing devices 202, 206 cooperating to provide the string/value pairs to the second computing device 206 during initialization. Furthermore, these modules could be operable at any time not just during initialization. An exemplary format for the look-up table 224 storing exemplary values is shown below in Table 1.

TABLE 1

| Long String Look-up | Hash Value |
|---|---|
| Mozilla Seamonkey (Gecko) | 1234 |
| Microsoft Internet Explorer 6.0 | 2345 |
| Safari 1.1 | 3456 |

Figure 3:
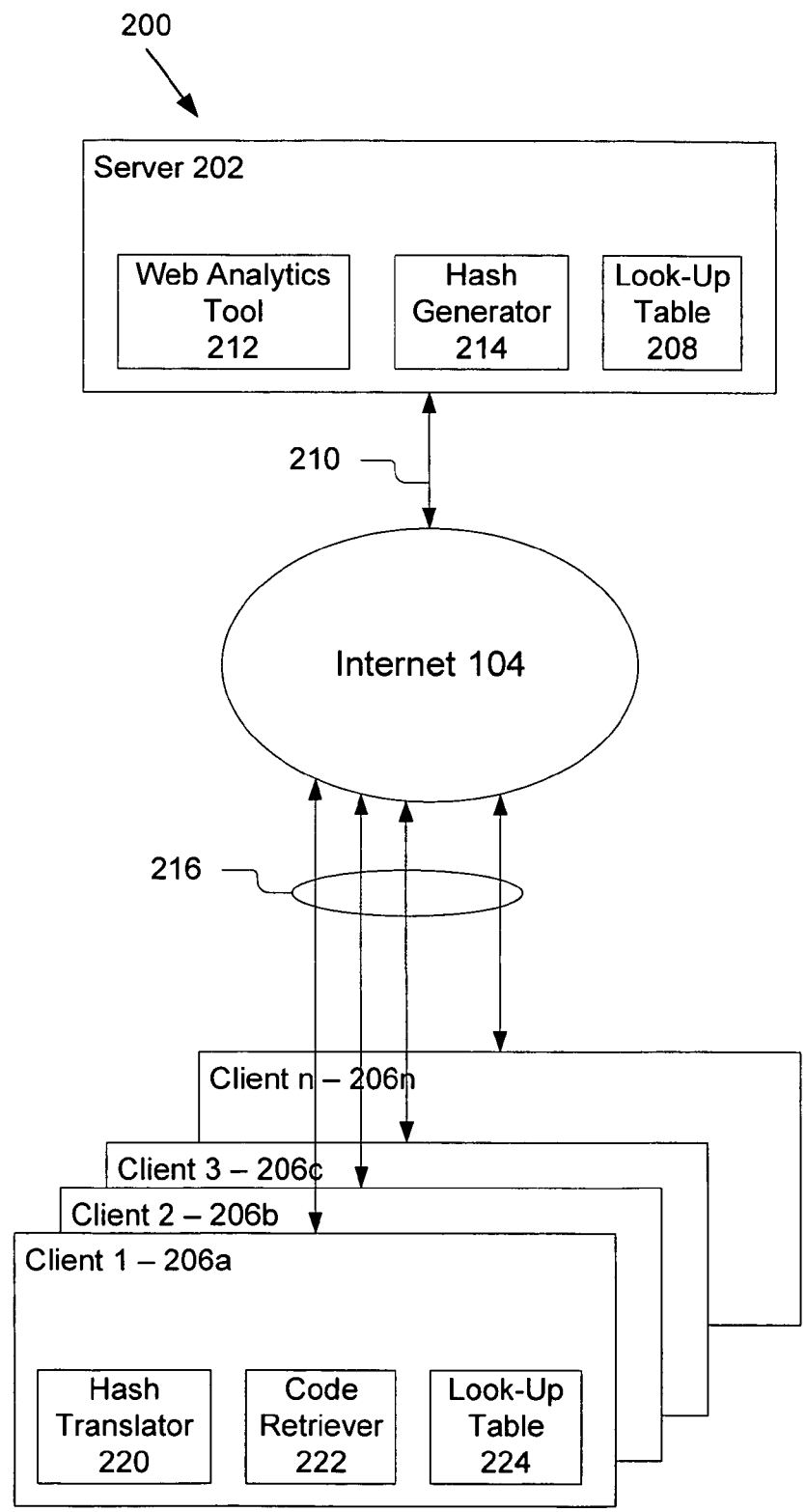
FIG. 3 is an exemplary embodiment of the present invention in a client/server architecture.

Referring now to FIG. 3, an exemplary embodiment of the present invention is shown. FIG. 3 illustrates how the present invention may be used in a client/server architecture to optimize the communication between a server 202 and several clients 1-*n* 206*a*-206*n*. With multiple clients 206*a*-206*n*, the network connections of each greatly increase the amount of data that must be transferred. In addition, the look-up table 208 at the server 202 has a large number of entries relative the look-up tables 224 at the client sites 206*a*-206*n*. Also, the look-up table 208 at the server 202 is shared by all of the clients 206*a*-206*n*. However, as noted above, the hash values and strings need only be sent once to the respective clients 206*a*-206*n*. This greatly reduces the bandwidth requirements and increases the speed at which displays of new information may be presented. The present invention has resulted in as much as a 50% decrease in the amount of time and bandwidth to present data.

By way of example, and exemplary data transfer in the prior art is compared with a data transfer using the present invention. In the prior art, data would be transferred using the following string to produce the corresponding three lines in a pane on the window/screen of FIG. 6: [Mozilla Seamonkey (Gecko)=283; Microsoft Internet Explorer 6.0=7087]. However, with the present invention, the data transfer over the network 104 is greatly reduced to: [1234=283; 2345=7087] used in conjunction with Table 1 above. As can be seen, even for just two segments, the data transfer is greatly reduced in size.

Figure 4:
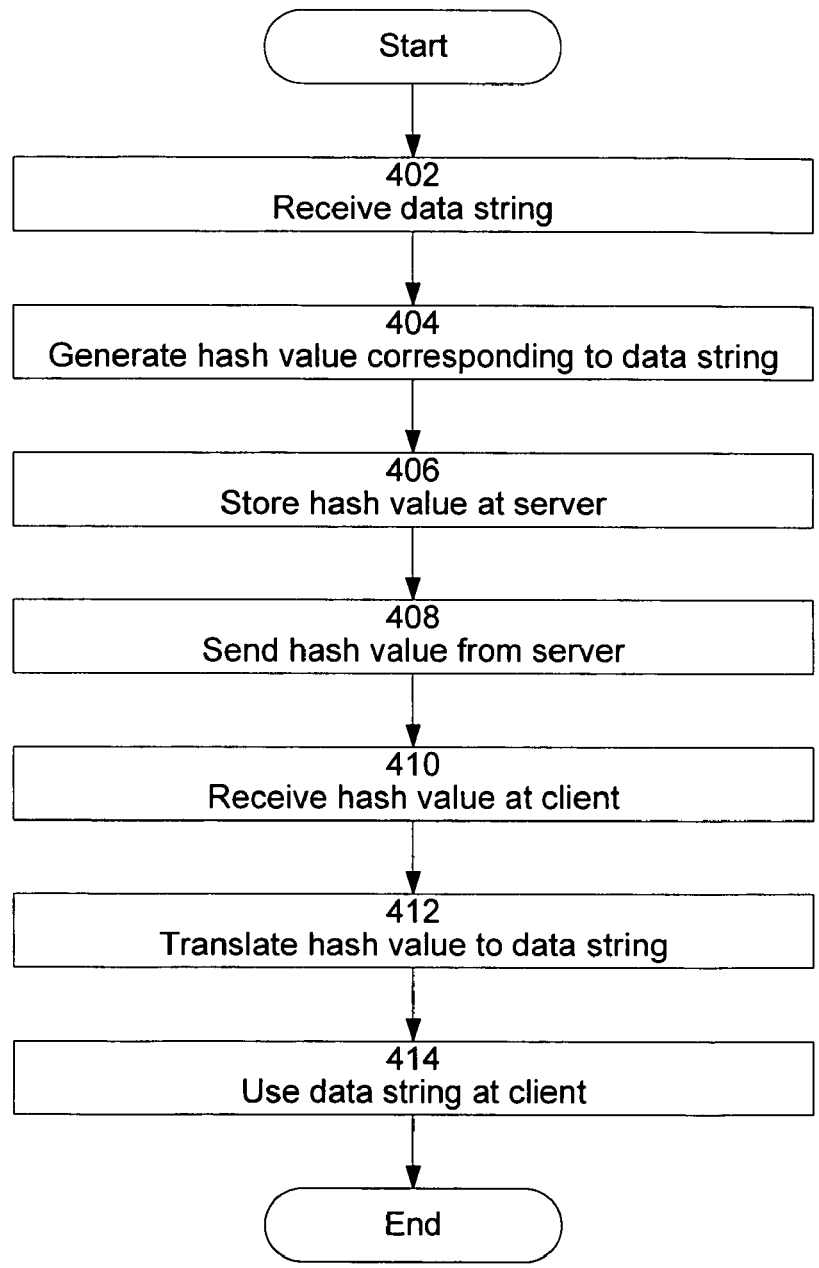
FIG. 4 is a flow chart showing one embodiment of a method for communicating between computing devices according to the present invention.

Referring now to FIG. 4, a preferred method for operation of the present invention is shown. While the present invention will now be described in the context of the client/server example of FIG. 3, those skilled in the art will recognize that the principles of the present invention are equally applicable to other computing systems and networks, and the client/server architecture used here is merely by way of example. The process begins with an operation to send data from the server 202 to the client 206, and receipt 402 of a data string by the web analytics tool 212 of the server 202. For example, the data may be information about a specific data set or information from the data set. The server 202 uses a hash generator 214 to generate 404 a hash value corresponding to the data string. This hash function may be any one of conventional types available such as MD2, MD4, and MD5 developed by Rivest or Secure Hash Algorithm (SHA) as specified in the Secure Hash Standard (SHS) and developed by NIST. The hash value and corresponding string are then stored 406 by the hash generator 214 in the look-up table 208. The values in the look-up table 208 in turn are used by the web analytics tool 212 and sent 408 by the server 202 over the network 104 to the second computing device. The second computing device 206 receives 410 the hash value. This could include retrieving a data string if the hash value is not present in the look-up table at the client 206. Then the hash translator 220 at the client 206 translates 412 the hash value to the data string using the look-up table 224. The data string is then used 414 by the client and presented such as shown by the displays of FIG. 6.

Figure 5:
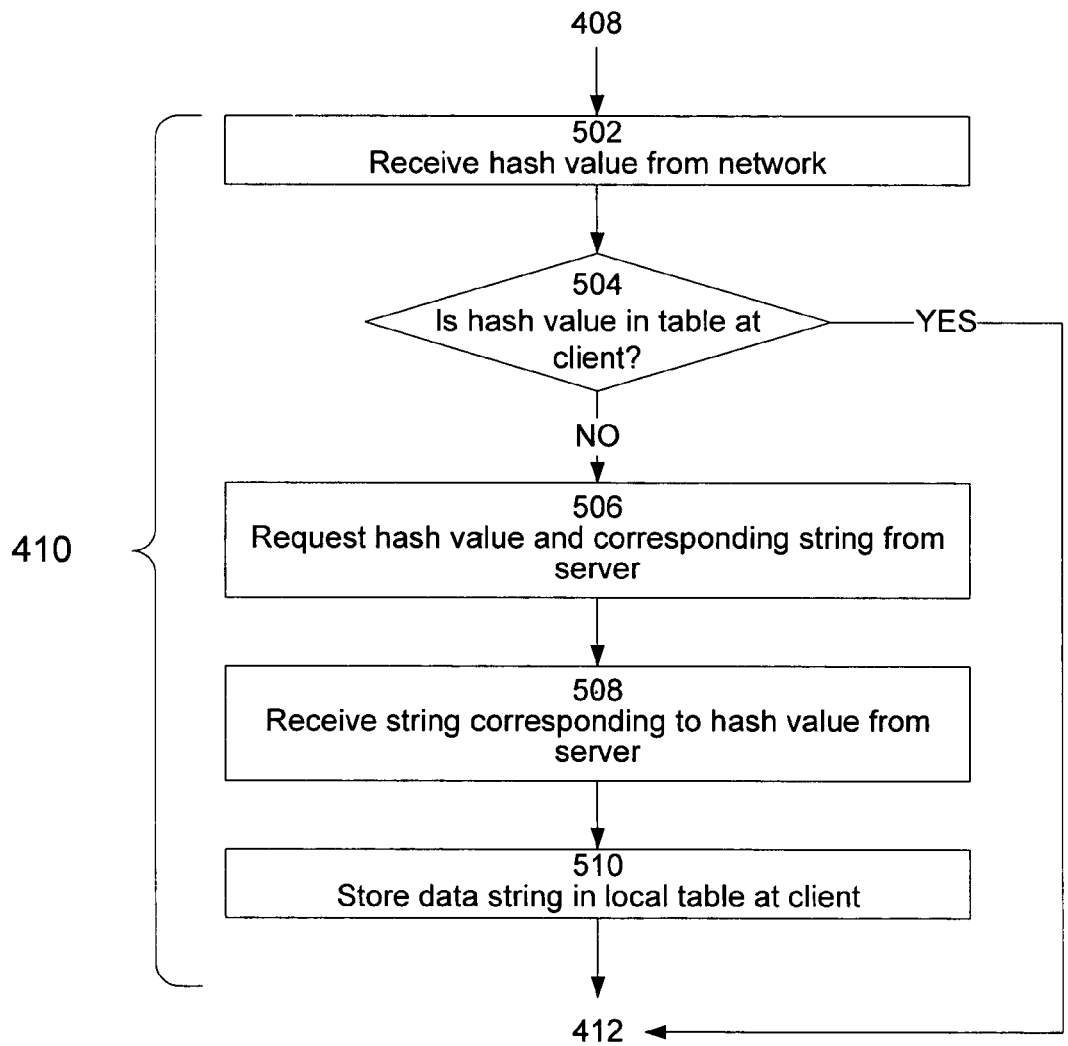
FIG. 5 is a flow chart showing one embodiment of a method for updating a translation table used to decode information at the local computing device.

Referring now to FIG. 5, one embodiment of a method for updating a translation table used to decode information at the local computing device 206 is shown. The method begins by receiving 502 a hash value or some other code from the network 104. Then the process determines whether the hash value is in the look-up table 224 at the client 206. If so the method continues to step 412 to translate the hash value to its corresponding data string. If not the method continues in step 506. In step 506, the code retriever 222 sends a request over the network 104 for the string value corresponding to the hash value. The server 202 receives the request, and the information is retrieved from the look-up table 208. The server 202 then sends the hash value and corresponding string to the client 206. The corresponding string is received 508 at the client 206, and the client updates 510 its look-up table 224 with both the hash value and the corresponding data string. After step 510, the method continues in step 412 of FIG. 4.

Those skilled in the art will recognize that FIG. 5 illustrates just one method for updating a translation table used to decode information at the local computing device 206. In one alternate embodiment, the local computing device 206 updates its translation table using a batch processing of hash value/data string pairs. For example, the local computing device 206 can send a plurality of hash values, and the server 202 will respond by sending the data strings corresponding to each of the hash values in the batch sent by the local computing device 206. For example, it could be just two hash values or it could be many more such at tens or hundreds. In yet another alternate embodiment, the server 202 tracks which hash values are sent to the local computing device 206, and the local computing device 206 simply sends a signal back to the server indicating it needs all the data strings corresponding to hash values that were sent to the local computing device 206 in the last transmission. Since the server 202 knows and has tracked the hash values that were sent in the last data transmission, the server 202 can generate hash value/data string pairs for that transmission and send them to the local computing device 206. Those skilled in the art will recognize that these are just two alternate embodiments for updating the translation table used to decode information at the local computing device 206 according to the present invention.

While the present invention has been described with reference to certain preferred embodiments, those skilled in the art will recognize that various modifications may be provided. For example, certain embodiments may employ multiple application servers, acting in cooperation to perform a function or request. Any of the above functions or requests can be sent across a network, or using local cables such as IEEE1394, Universal Serial Bus, or wireless networks such as IEEE 802.11 or IEEE 802.15 networks, in any combination. Variations upon and modifications to the preferred embodiments are provided for by the present invention.

What is claimed is:

1. A system for reducing an amount of data transmitted over a network between computing devices by using coded values, the system comprising:
   a first computing device comprising:
      a web analytics tool configured to collect data representative of a plurality of interactions of a plurality of users with a content site; and
      a code generator configured to:
         receive, from the web analytics tool, a string of data representative of user interaction with a content site; and
         generate a code representing the received string of data, wherein the code has a length that is less than a length of the received string of data,
      wherein the first computing device is configured to transmit, to a second computing device via the network, the code without the string of data corresponding to the code; and
   a second computing device comprising a code translator having locally stored data associating one or more codes with one or more strings of data representative of user interaction with a content site, wherein the locally stored data is stored locally at the second computing device prior to the first computing device transmitting the code via the network, and wherein the code translator is configured to:
      receive the code transmitted from the first computing device; and
      identify, from the locally stored data, a string of data corresponding to the code transmitted from the first computing device.

2. The system of claim 1 wherein the code generator is a hash generator that generates a hash value using the string of data, and the hash value is used as the code.

3. The system of claim 2 wherein the hash generator uses one hash function from the group of MD2, MD4, MD5, Secure Hash Algorithm and Secure Hash Standard.

4. The system of claim 2 wherein the code translator receives the hash value, and is capable of translating the hash value back to the string of data.

5. The system of claim 1 wherein the code generator further comprises a look up table for storing at least one pair of the code and string of data corresponding with the code, the look up table being coupled to the code generator for receiving a string and outputting a corresponding code, and for receiving a pair of the code and string of data corresponding with the code for storage in the look up table.

6. The system of claim 1 wherein the code translator further comprises a look up table for storing at least one pair of a code and a string of data representative of user interaction with a content site, the look up table coupled to the code translator for receiving the code from the web analytics tool and outputting the string of data corresponding to the code from the web analytics tool.

7. The system of claim 1 wherein the first computing system is coupled to the second computing system by the network.

8. The system of claim 1 wherein identifying comprises:
comparing the received code to the locally stored data to determine whether the locally stored data includes a string of data corresponding to the received code; and
if it is determined that the locally stored data does not include a string of data corresponding to the received code, the second computing device requesting that the first computing device provide, to the second computing device, the string of data corresponding to the received code.

9. The system of claim 1 wherein the first computing system comprises a module for sending pairs of codes and strings of data for storage at the second computing device during initialization of a connection between the first computing device and the second computing device.

10. A device for reducing an amount of data transmitted over a network between computing devices by using coded values, the device comprising:
a web analytics tool having an input and an output, the web analytics tool configured to collect data representative of a plurality of interactions of a plurality of users with a content site; and
a code generator configured to:
receive, from the web analytics tool, a string of data representative of user interaction with a content site; and
generate a code representing the received string of data, wherein the code has a length that is less than a length of the received string of data,
wherein the device is configured to:
transmit, to an other computing device on the network, the code without the string of data corresponding to the code,
receive, from the other computing device on the network after having transmitted the code, a request to provide a string of data corresponding to the transmitted code; and
transmit, to the other computing device and in response to receiving the request, the string of data corresponding to the transmitted code.

11. The device of claim 10 wherein the code generator is a hash generator that generates a hash value using the string of data, and the hash value is used as the code.

12. The device of claim 11 wherein the hash generator uses one hash function from the group of MD2, MD4, MD5, Secure Hash Algorithm and the Secure Hash Standard.

13. The device of claim 10 further comprising a module for sending pairs of codes and strings of data for storage at a remote second computing device.

14. A device for reducing an amount of data transmitted over a network between computing devices by using coded values, the device comprising:
a module for presentation of data received by a remote web analytics tool configured to collect data representative of a plurality of interactions of a plurality of users with a content site; and
a code translator configured to receive a code from the web analytics tool via the network, wherein the code translator has locally stored data associating one or more codes with one or more strings of data representative of interactions of users with a content site, wherein the locally stored data is stored locally at the code translator prior to transmission of the code via the network, and wherein the code translator is configured to identify, from the locally stored data, a string of data representative of interactions of users with a content site that corresponds to the received code.

15. The device of claim 14 wherein the code translator is a hash translator that generates the string of data from a hash value.

16. The device of claim 15 wherein the hash translator uses one hash function from the group of MD2, MD4, MD5, Secure Hash Algorithm and Secure Hash Standard.

17. The device of claim 14 further comprising a look up table for storing at least one pair of the code and the string of data corresponding to the code, the look up table being coupled to the code translator for receiving a code and outputting a corresponding string.

18. The device of claim 14 further comprising a code retriever for retrieving the code and the string of data corresponding to the code, the code retriever coupled for communication with a code source, wherein the code retriever is configured to:
compare the received code to the locally stored data to determine whether the locally stored data includes a string of data corresponding to the received code; and
if it is determined that the locally stored data does not include a string of data corresponding to the received code, request that the code source provide, to the code retriever, the string of data corresponding received code.

19. The device of claim 14 further comprising a module downloading and locally storing pairs of codes and strings of data for use by the code translator.

20. A method for sending web analytics data from a web analytics tool to a remote presentation module, the method comprising the steps of:
receiving, from a web analytics tool configured to collect data representative of interactions of users with a content site, a data string describing interactions of users with a content site;
generating, using a computing device, a code representing the received data string describing interactions of users with a content site, the code having a length less than a length of the received data string;
sending, to a remote presentation module, the code in place of the data string such that the code is transmitted to the remote presentation module without the string of data corresponding to the code;
receiving, after having sent the code to the remote presentation module, a request to provide a string of data corresponding to the transmitted code; and
transmitting, to the remote presentation module and in response to receiving a request to provide a string of data corresponding to the transmitted code, the string of data corresponding to the transmitted code.

21. The method of claim 20 further comprising the step of receiving a request from the web analytics tool to send data to the remote presentation module.

22. The method of claim 20 wherein the step of generating the code, generates a hash value using the data string.

23. The method of claim 22 wherein a hash function used in the step of generating is one from the group of MD2, MD4, MD5, Secure Hash Algorithm and Secure Hash Standard.

24. The method of claim 20 further comprising the step of storing the code and corresponding data string in a look up table.

25. The method of claim 24 wherein the step of generating a code corresponding to the data string is performed by retrieving the code corresponding to the data string in the look up table.

26. The method of claim 20 further comprising the step of replacing the data string with the code in transmission data to be sent from the web analytics tool to a remote presentation module.

27. The method of claim 20 further comprising the steps of:
receiving the code at the remote presentation module;
translating the code to the data string by accessing stored data associating one or more codes with one or more data strings describing interactions of users with a content site;
replacing the code with the data string before use by the remote presentation module; and
presenting the translated data string to a user.

28. A method for receiving web analytics data from a web analytics tool for presentation at a remote presentation module, the method comprising the steps of:
receiving, at the remote presentation module and from a device comprising a web analytics tool configured to collect data representative of a plurality of interactions of a plurality of users with a content site, a code without receiving a string of data corresponding to the code;
translating the code to the corresponding data string by accessing locally stored data associating one or more codes with one or more data strings describing interactions of users with a content site, wherein the locally stored data is stored locally at a computing device comprising the remote presentation module prior to a computing device comprising the web analytics tool transmitting the code; and
replacing the code with the corresponding data string before use by the remote presentation module;
presenting the translated data string to a user.

29. The method of claim 28 wherein the step of translating the code, translate a hash value back to its original value.

30. The method of claim 29 wherein a hash function used in the step of generating is one from the group of MD2, MD4, MD5, Secure Hash Algorithm and Secure Hash Standard.

31. The method of claim 28 further comprising the step of storing locally the code and corresponding data string in a look up table.

32. The method of claim 31 wherein the step of translating the code to the data string is performed by retrieving the data string corresponding to the code from the look up table.

33. The method of claim 31 further comprising:
determining that the locally stored data does not include a data string corresponding to the code received;
retrieving, from the web analytics tool and in response to determining that the locally stored data does not include a data string corresponding to the code received, a data string corresponding to the code received; and
updating the look up table by storing the code received and the corresponding data string in association with one another in the look up table.

34. The method of claim 28 further comprising the step retrieving a pair of code/data string from the web analytics tool.

* * * * *